United States Patent
Endo et al.

(10) Patent No.: US 7,955,480 B2
(45) Date of Patent: Jun. 7, 2011

(54) SPUTTERING APPARATUS AND FILM DEPOSITION METHOD

(75) Inventors: Tetsuya Endo, Komae (JP); Einstein Noel Abarra, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/683,921

(22) Filed: Jan. 7, 2010

(65) Prior Publication Data

US 2010/0155229 A1 Jun. 24, 2010

Related U.S. Application Data

(63) Continuation of application No. PCT/JP2008/073295, filed on Dec. 22, 2008.

(51) Int. Cl.
*C23C 14/35* (2006.01)
(52) U.S. Cl. ......... 204/192.12; 204/192.13; 204/298.03; 204/298.11; 204/298.23; 204/298.28; 204/298.29; 204/298.19; 204/298.17
(58) Field of Classification Search ............ 204/192.11, 204/192.12, 192.13, 298.03, 298.04, 298.11, 204/298.23, 298.26, 298.27, 298.28, 298.17, 204/298.19
See application file for complete search history.

(56) References Cited

U.S. PATENT DOCUMENTS

| 5,962,080 A | * | 10/1999 | Tan et al. | 427/529 |
| 6,224,718 B1 | * | 5/2001 | Meyer | 204/192.12 |
| 2008/0011602 A1 | * | 1/2008 | Ota et al. | 204/192.1 |

FOREIGN PATENT DOCUMENTS

| JP | 63-257941 | 10/1988 |
| JP | 6-271400 | 9/1994 |
| JP | 7-54145 | 2/1995 |
| JP | 8-296042 | 11/1996 |
| JP | 11-200040 | 7/1999 |
| JP | 2002-266071 | 9/2002 |
| JP | 2008-019498 | 1/2008 |

* cited by examiner

*Primary Examiner* — Rodney G McDonald

(74) *Attorney, Agent, or Firm* — Fitzpatrick, Cella, Harper & Scinto

(57) ABSTRACT

The present invention provides a sputtering apparatus and a film deposition method capable of forming a magnetic film with reduced variations in the direction of magnetic anisotropy. The sputtering apparatus of the present invention is provided with a rotatable cathode (802), a rotatable stage (801) and a rotatable shielding plate (805). The sputtering apparatus controls the rotation of at least one of the cathode (802), stage (801) and shielding plate (805) so that sputtered particles impinging at an angle formed with respect to a normal line of the substrate (804) of 0° or more and 50° or less out of sputtered particles generated from the target (803*a*) during sputtering are made to impinge on the substrate (804).

14 Claims, 15 Drawing Sheets

ANGLE OF INCIDENCE
10 TO 70°

ANGLE OF INCIDENCE
70° OR MORE

SMALL SLIT WIDTH

LARGE SLIT WIDTH

SPUTTERING APPARATUS AND FILM DEPOSITION METHOD

CROSS-REFERENCES TO RELATED APPLICATIONS

This application is a continuation application of International Application No. PCT/JP2008/073295, filed on Dec. 22, 2008, the entire contents of which are incorporated by reference herein.

TECHNICAL FIELD

The present invention relates to a sputtering apparatus and a film deposition method.

BACKGROUND ART

Since the use of magnetic elements for high-frequency applications in reading/writing heads, micro-inductors, micro-transformers or the like is spreading and magnetic thin films having good high-frequency characteristics in GHz bands are also demanded in recent years, related research and development are also positively being undertaken. Using magnetic thin films in high-frequency bands requires electric resistance of thin films to be increased so as to reduce eddy current and increase the resonance frequency. As a method of increasing the resonance frequency, anisotropic magnetic field Hk or saturation magnetization Ms may be increased, but it is generally difficult to increase Hk and Ms simultaneously and Hk and Ms are in a trade-off relationship. However, in recent years, it has been made possible to increase uniaxial magnetic anisotropy based on shape effects of crystal by causing sputtered particles to diagonally impinge on and to be oriented to a substrate using a sputtering method or ion beam method and thereby increase Hk while keeping high Ms.

An object of a diagonal incidence of sputtered particles as described above is to generate shape magnetic anisotropy within a film through the diagonal incidence and to provide high magnetic anisotropy. What becomes important here is:
[1] How to suppress variations in magnetic anisotropy.
[2] To what extent the magnetically easy axis (magnetically hard axis) should be aligned.

This is because since head chips are cut out in large quantity from a single wafer, if there are large variations in the above two aspects within the wafer surface, the performance of the individual cut heads becomes nonuniform.

In the current diagonal incidence film deposition of sputtered particles, when volume production is taken into consideration, sputtered particles having various angles of incidence arrive at a substrate and the various angles of incidence produce variations in magnetic anisotropy.

<Case 1>
For example, in the film deposition to uniformalize angles of incidence of sputtered particles, a collimator 1 may be arranged between a target 2 and a substrate 4 as shown in <case 1> of FIG. 1. In this way, selecting a direction of incidence of sputtered particles 3 generated from the target 2 allows highly uniform film deposition. However, this method causes the number of arriving sputtered particles 3 to decrease, resulting in a decrease in productivity.

<Case 2>
When the diameter of the collimator 1 is increased as shown in <case 2> of FIG. 1, sputtered particles 3 impinge on the substrate 4 from various directions. Therefore, variations in magnetic anisotropy may be produced but there is an expectation for volume production.

<Case 3>
However, in the case of <case 2>, uniform film deposition over the entire surface of the substrate 4 requires the substrate 4 or target 2 to be moved. In this case, the angle of incidence of sputtered particles 3 on the substrate 4 varies depending on the relative positional relationship between the target 2 and substrate 4. That is, when the target 2 is fixed and the substrate 4 is moved as shown in <case 3> of FIG. 1, the angle of incidence of sputtered particles 3 may increase or decrease depending on the position of the moving substrate 4. Thus, the variations in the angle of incidence of sputtered particles 3 cause variations in magnetic anisotropy of the film formed on the substrate 4.

The "angle of incidence" in the present specification denotes an angle formed by the normal line of the substrate, which is the film deposition target on which sputtered particles impinge, and the direction of incidence of incident sputtered particles. Therefore, a "low angle of incidence" is an angle of incidence when the inclination of the direction of incidence of sputtered particles from the normal line of the substrate is relatively small, while a "high angle of incidence" is an angle of incidence when the inclination of the direction of incidence of sputtered particles from the normal line of the substrate is relatively large.

The reason why variations are produced in magnetic anisotropy depending on the angle of incidence is that the direction of magnetically easy axis (magnetically hard axis) or magnitude (Hk) of anisotropic magnetic field greatly depends on the angle of incidence.

For example, as shown in FIG. 2, when the angle of incidence of sputtered particles 5 ranges from 10° to 70°, a magnetically easy axis 6 is formed in the direction perpendicular to the direction of incidence. On the other hand, when the angle of incidence of sputtered particles 5 is 70° or more, the magnetically easy axis 6 is formed parallel to the direction of incidence. That is, since the direction of magnetically easy axis changes depending on the angle of incidence of incident sputtered particles of which the magnetic film is made up, which eventually influences a skew dispersion angle (definition: angle deviation width of magnetically easy axis).

Patent Document 1 discloses a technique of controlling anisotropy of a ferromagnetic film formed using a carousel type sputtering apparatus. To be more specific, the direction and magnitude of magnetic anisotropy are controlled by disposing a mask whose width of aperture is changeable between a magnetic target and a rotating substrate holder and changing the width of aperture of the mask.

Furthermore, Patent Document 2 discloses a method for depositing an insulating thin film on a magnetic head and uniformly forming the insulating thin film over a large surface area. FIG. 3 is a schematic view of a deposition apparatus disclosed in Patent Document 2. The deposition apparatus shown in FIG. 3 is provided with a chamber 11 that houses a first ion beam gun 12, a second ion beam gun 13, a target holder 14 and a substrate support body 16.

The substrate support body 16 has a turn table 16a which is rotatable about a shaft 16b (around an axis 21a) and a substrate mount 16c which is rotatable about an axis 21b. A substrate 17 for depositing a target member thereon can be disposed on the substrate mount 16c. On the other hand, the target holder 14 is configured to be swingable in the direction of an arrow 22 and allows a target 15 to be mounted.

The first ion beam gun 12 is disposed so that an ion beam 18 impinges on the target 15 and the ion beam 18 causes the target member to be diffused from the target 15 in random directions 20. Furthermore, the second ion beam gun 13 is provided so as to cause another ion beam 19 to impinge on the substrate 17 during the deposition process.

According to the method disclosed in Patent Document 2, it is possible to achieve a uniform film thickness on the substrate 17 by appropriately rotating the target holder 14, turn table 16a and substrate mount 16c in the above configuration.

Patent Document 1: Japanese Patent Application Laid-Open No. H7-54145

Patent Document 2: Japanese Patent Application Laid-Open No. H8-296042

DISCLOSURE OF THE INVENTION

According to the above described method disclosed in Patent Document 1, when the direction of the magnetically easy axis is set to a first direction of the substrate (e.g., X direction), the width of aperture of the mask is controlled to be reduced. Under this control, Patent Document 1 discloses that when the substrate is located at any position (position A) other than the position (parallel position) where the substrate surface disposed on the rotating substrate holder and the target surface are opposed to each other, a component (X) parallel to the first direction and a component (Y) parallel to a second direction (Y direction) orthogonal to the first direction of incident sputtered particles do not impinge on the substrate due to the mask. On the other hand, when the substrate is located at a position (position B) where the substrate surface disposed on the rotating substrate holder and the target surface are opposed to each other, the component (X) parallel to the first direction impinges on the substrate at an angle nearly perpendicular and the component (Y) parallel to the second direction (Y direction) impinges on the substrate at an acute angle (high angle of incidence). Thus, the disclosed method is intended to increase the magnetically easy axis in the first direction.

However, even if the width of aperture of a mask 42 is reduced as shown in FIG. 4, when the substrate is located at a position A, there may exist sputtered particles impinging on a substrate 41 at an acute angle (high angle of incidence) (component (X) 44 parallel to the first direction). This component (X) forms a magnetically easy axis in the second direction. Therefore, the magnetically easy axis is formed not only in the first direction but also in the second direction, causing irregularities of the magnetically easy axis.

Furthermore, when film deposition is performed while rotating the substrate holder, the angle of incidence of sputtered particles 54 incident from a target 53 on a substrate 51 varies between both ends of the substrate 51 as shown in FIG. 5A and FIG. 5B. This is exactly nothing more or less than the current problem explained in <case 3>. FIG. 5A illustrates a case where the width of aperture of a mask 52 is small, while FIG. 5B illustrates a case where the width of aperture of the mask 52 is large.

In FIGS. 4, 5A and 5B, substrate holders in which the substrates 41 and 51 are disposed are omitted for simplification of drawings.

Furthermore, since the rotation speed of the substrate holder of the carousel type sputtering apparatus in Patent Document 1 is constant, it is difficult to adjust the distribution of film thickness.

Thus, the technique disclosed in Patent Document 1 can control the direction of the magnetically easy axis formed, whereas the technique has difficulty in uniformalizing magnetic anisotropy and the distribution of film thickness.

Furthermore, in Patent Document 2, film deposition is performed while rotating the turn table 16a and substrate mount 16c aiming at forming an insulating thin film so as to have a uniform thickness. Therefore, sputtered particles impinge on the substrate 17 from all directions. Furthermore, sputtered particles impinge on the substrate 17 at all angles from a low angle of incidence to a high angle of incidence. Therefore, magnetic anisotropy formed in the substrate 17 becomes isotropic and it is difficult to align the magnetically easy axis appropriately. In the first place, Patent Document 2 has no discussion about reducing variations in magnetic anisotropy.

Furthermore, the technique in Patent Document 2 uses the second ion beam gun 13 to form a thin film having an appropriate density. That is, the technique in Patent Document 2 tries to improve adherence of a film through an appropriate degree of bombardment with an auxiliary beam irradiated from the second ion beam gun 13.

Thus, the technique described in Patent Document 2 needs the first ion beam gun and the second ion beam gun to keep an appropriate density of the thin film formed and to form a uniform thin film, which may lead to complication of the apparatus and a cost increase.

The present invention has been implemented in view of the above described problems and it is an object of the present invention to provide a sputtering apparatus and a film deposition method capable of forming a magnetic film with reduced variations in directions of magnetic anisotropy.

Furthermore, it is another object of the present invention to provide a sputtering apparatus and a film deposition method in a simple configuration capable of uniformalizing an atomic density in a film formed by sputtering.

A first aspect of the present invention is a sputtering apparatus including a cathode having a sputtering target supporting surface, the sputtering target supporting surface being rotatable about a first rotating shaft, a stage having a substrate supporting surface, the substrate supporting surface being rotatable about a second rotating shaft disposed parallel to the first rotating shaft, and a shielding plate disposed between the sputtering supporting surface and the substrate supporting surface that is rotatable about the first rotating shaft or the second rotating shaft, wherein the rotation of at least one of the sputtering target supporting surface, the substrate supporting surface and the shielding plate is controlled so that sputtered particles impinging at an angle formed with respect to a normal line of the substrate supporting surface of 0° or more and 50° or less out of sputtered particles generated from the sputtering target supported on the sputtering target supporting surface during sputtering are made to impinge on the substrate supported on the substrate supporting surface.

Furthermore, a second aspect of the present invention is a film deposition method by a sputtering apparatus including a cathode having a sputtering target supporting surface, the sputtering target supporting surface being rotatable about a first rotating shaft, a stage having a substrate supporting surface, the substrate supporting surface being rotatable about a second rotating shaft disposed parallel to the first rotating shaft, and a shielding plate disposed between the sputtering supporting surface and the substrate supporting surface that is rotatable about the first rotating shaft or the second rotating shaft, wherein at least one of the sputtering target supporting surface, the substrate supporting surface and the shielding plate is rotated independently so that sputtered particles impinging at an angle formed with respect to a normal line of the substrate supporting surface of 0° or more and 50° or less out of sputtered particles generated from the sputtering target supported on the sputtering target supporting surface during sputtering are made to impinge on the substrate supported on the substrate supporting surface.

BEST MODES FOR CARRYING OUT THE INVENTION

Figure 1:
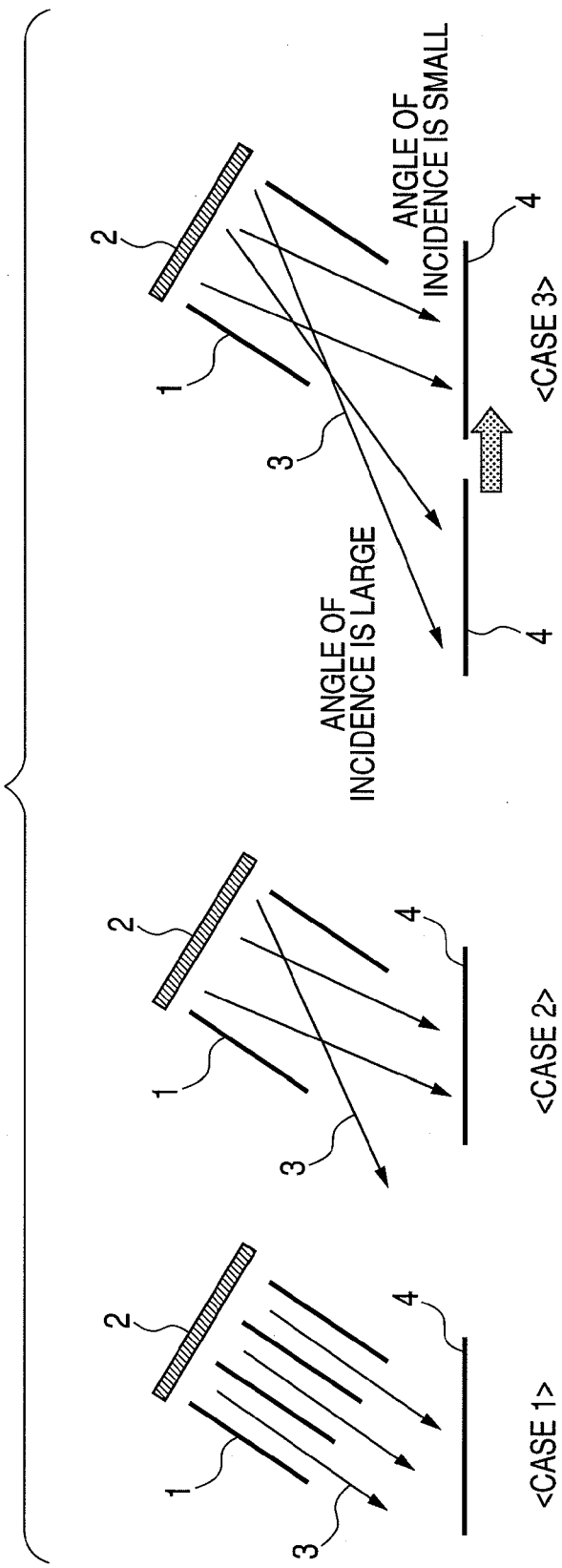
FIG. 1 is a diagram illustrating that variations in magnetic anisotropy are caused by sputtered particles having various angles of incidence in the prior art.
Figure 2:
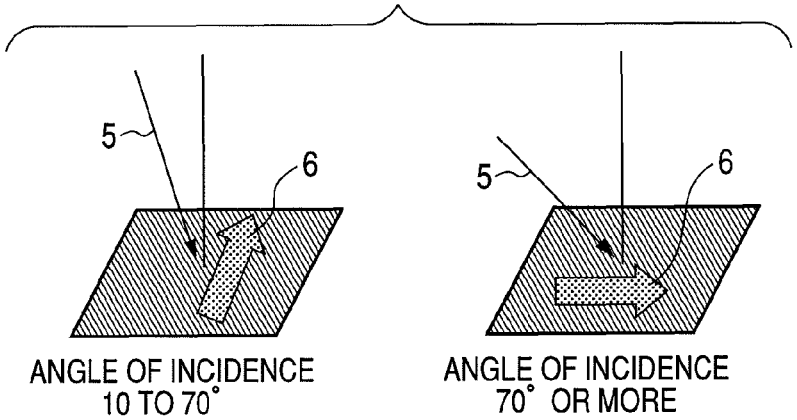
FIG. 2 is a diagram illustrating how the direction of a magnetically easy axis formed varies depending on an angle of incidence.
Figure 3:
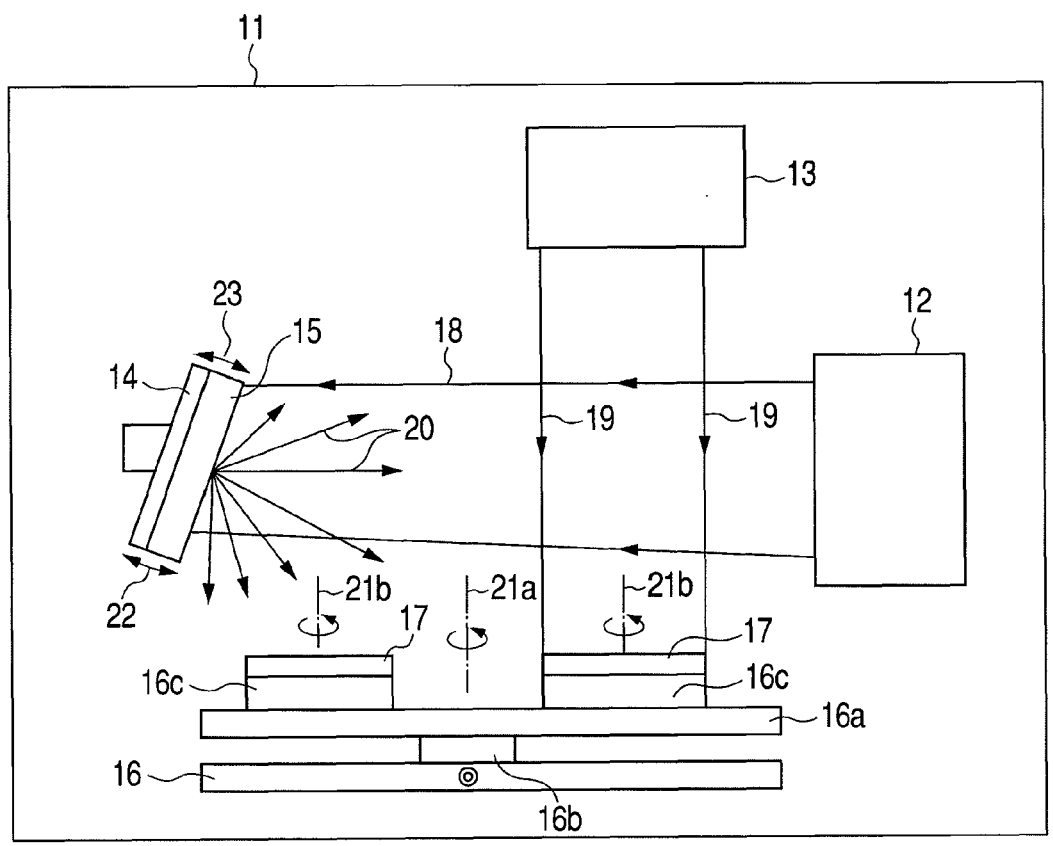
FIG. 3 is a schematic block diagram of a conventional deposition apparatus.
Figure 4:
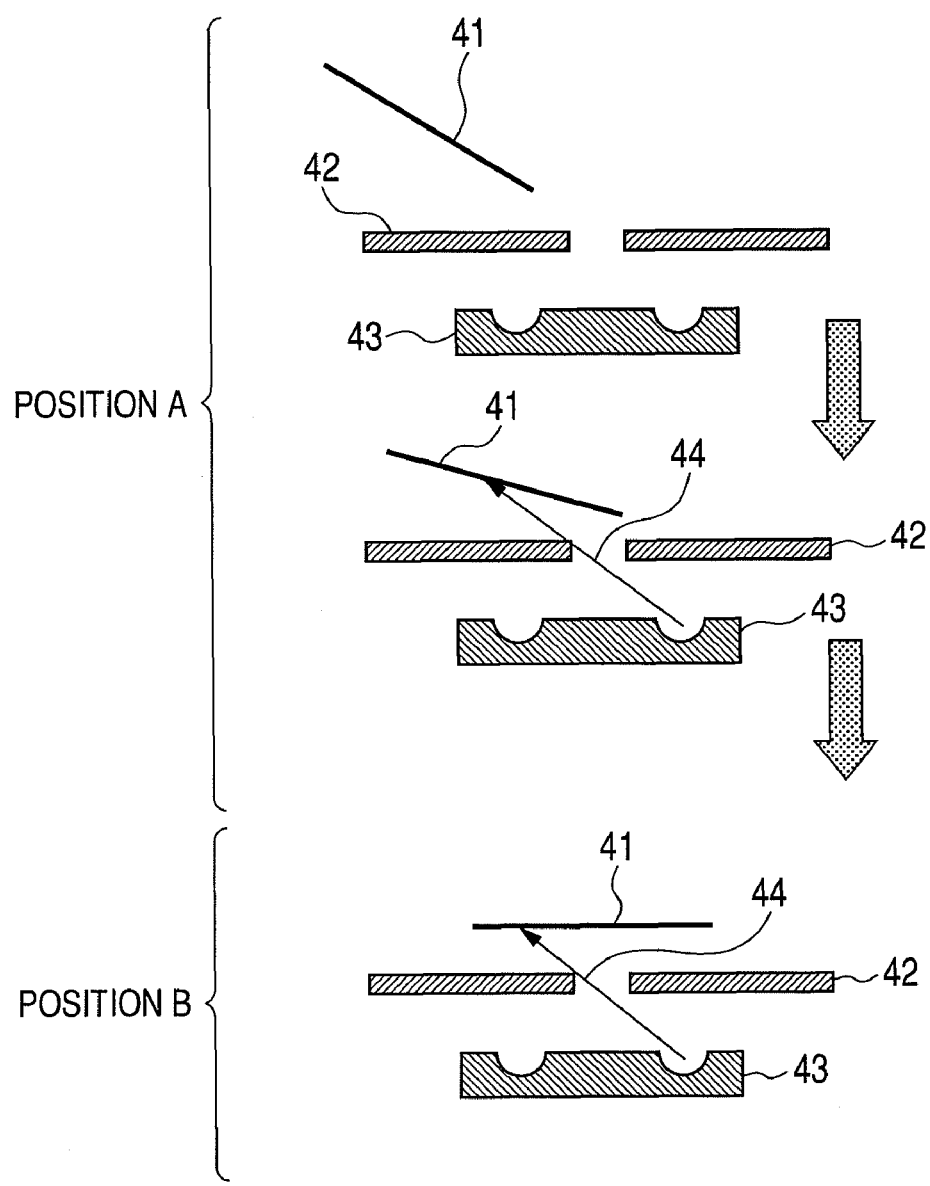
FIG. 4 is a diagram illustrating that irregularities of the magnetically easy axis occur in the sputtering method disclosed in Patent Document 1.
Figure 5A:
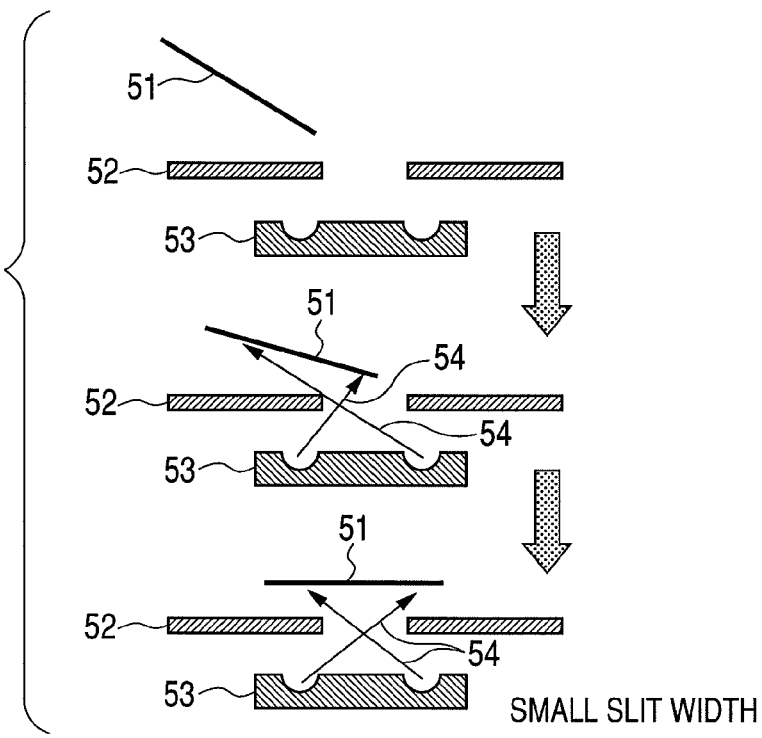
FIG. 5A is a diagram illustrating that irregularities of the magnetically easy axis occur in the sputtering method disclosed in Patent Document 1.
Figure 5B:
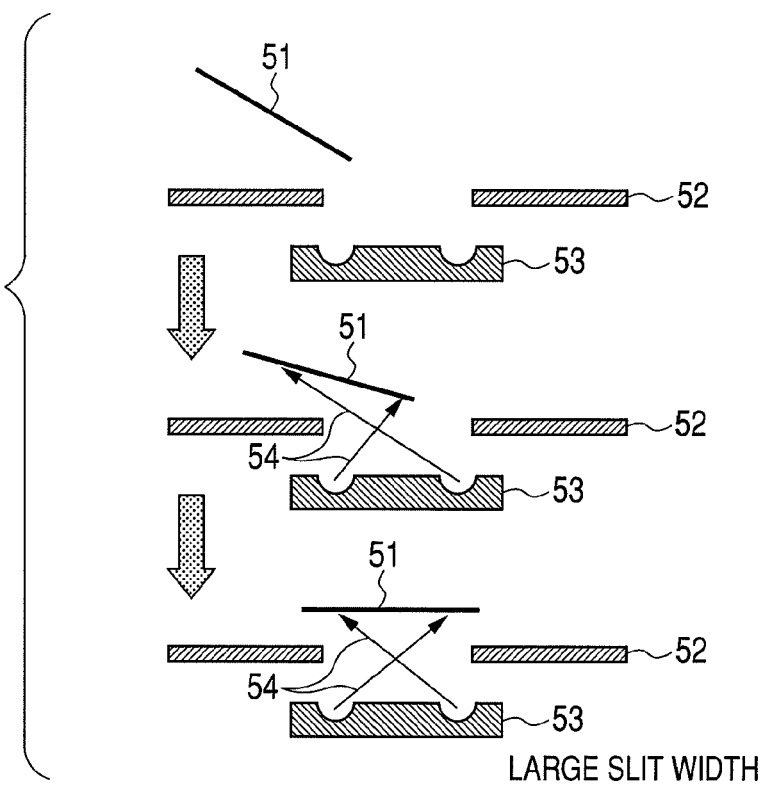
FIG. 5B is a diagram illustrating that irregularities of the magnetically easy axis occur in the sputtering method disclosed in Patent Document 1.

Hereinafter, embodiments of the present invention will be explained in detail with reference to the accompanying drawings. In the drawings explained below, those having the same functions will be assigned the same reference numerals and repeated explanations thereof will be omitted.

<Basic Configuration>

Figure 6A:
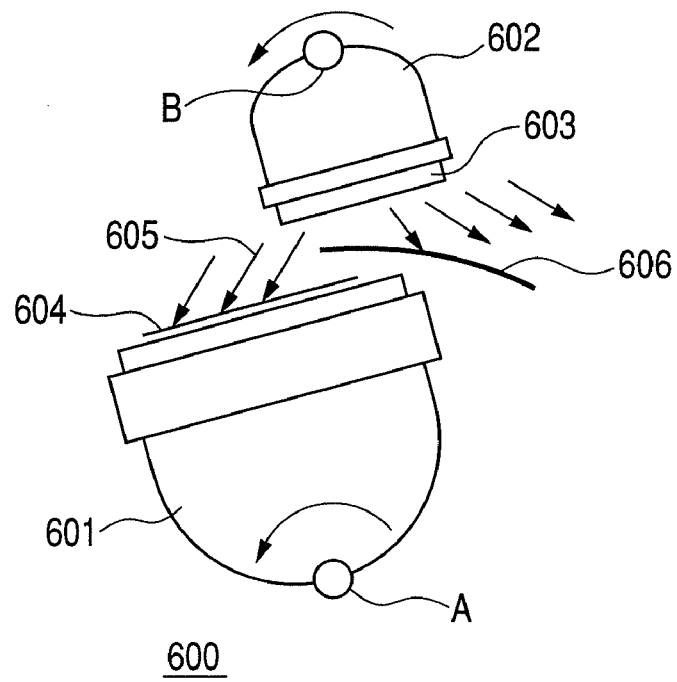
FIG. 6A is a side view of a sputtering apparatus according to an embodiment of the present invention.
Figure 6B:
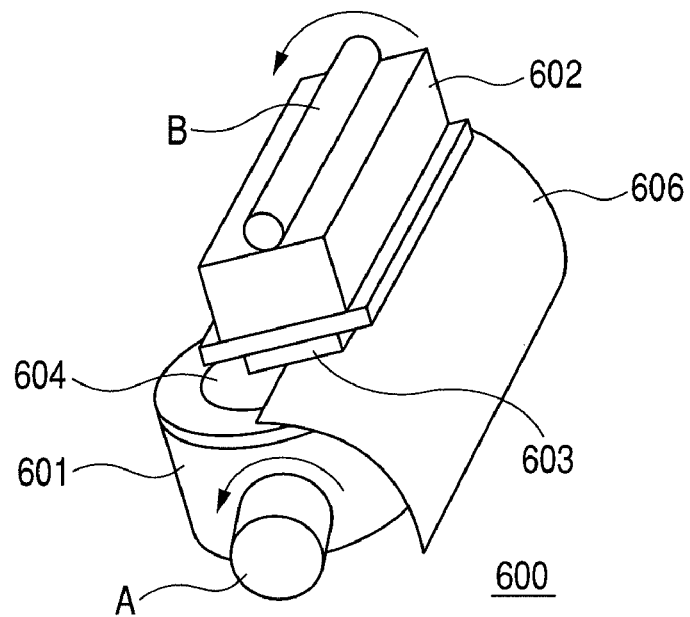
FIG. 6B is a perspective view of the sputtering apparatus according to the embodiment of the present invention.

FIG. 6A is a side view of a sputtering apparatus 600 according to an embodiment of the present invention. FIG. 6B is a perspective view of the sputtering apparatus 600 according to the embodiment of the present invention.

In FIGS. 6A and B, the sputtering apparatus 600 is provided with a stage 601 on which a substrate 604 is mounted, a cathode 602 that supports a target 603 and a shielding plate 606, and the target supporting surface of the cathode 602 and the substrate supporting surface of the stage 601 are arranged so as to face each other. The stage 601 and the cathode 602 are provided with a rotating shaft A and a rotating shaft B respectively, and the stage 601 and the cathode 602 are rotatable about the rotating shaft A and the rotating shaft B within an arbitrary angle respectively. For example, the stage 601 and the cathode 602 can be rotated using rotation means such as a motor and the rotation means can be controlled by a control apparatus.

The rotating shaft A and the rotating shaft B are arranged parallel to each other and the cathode 602 can support the target 603 so as to be parallel to the rotating shaft B. The target 603 supported on the cathode 602 which is rotatable about the rotating shaft B within an arbitrary angle can deposit sputtered particles 605 on the substrate 604 by causing ions in plasma to collide with the surface of the target 603 while either stationary or rotating.

During film deposition processing, the substrate 604 to which film deposition processing is applied by the target 603 is mounted on the stage 601 which is rotatable about the rotating shaft A within an arbitrary angle. The substrate supporting surface of the stage 601 and the target supporting surface of the cathode 602 are configured to be independently rotatable about the rotating shaft A and the rotating shaft B respectively.

Furthermore, the shielding plate 606 is provided between the target 603 and the stage 601. The shielding plate 606 has means for rotating about either the rotating shaft A or rotating shaft B within an arbitrary angle and has the function of fine tuning a thickness distribution of a film deposited and increasing selectivity of the angle of incidence of sputtered particles. The shielding plate 606 can rotate about the rotating shaft A or rotating shaft B using an arbitrary method, but in the embodiment explained below, the shielding plate 606 is configured to be rotatable about the rotating shaft A. The shielding plate 606 can be controlled by a control apparatus so as to rotate independently of the cathode 603 or stage 601.

Figure 7A:
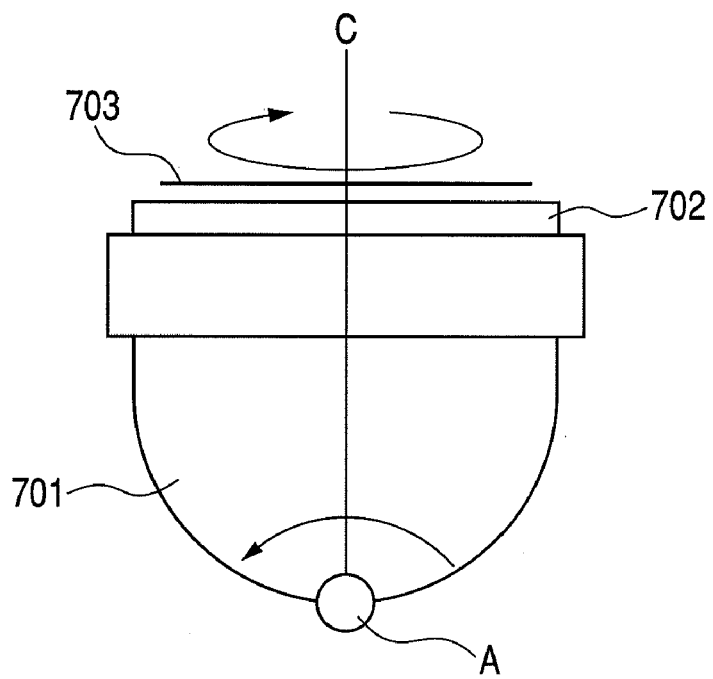
FIG. 7A is a side view of the substrate mounting stage according to the embodiment of the present invention.
Figure 7B:
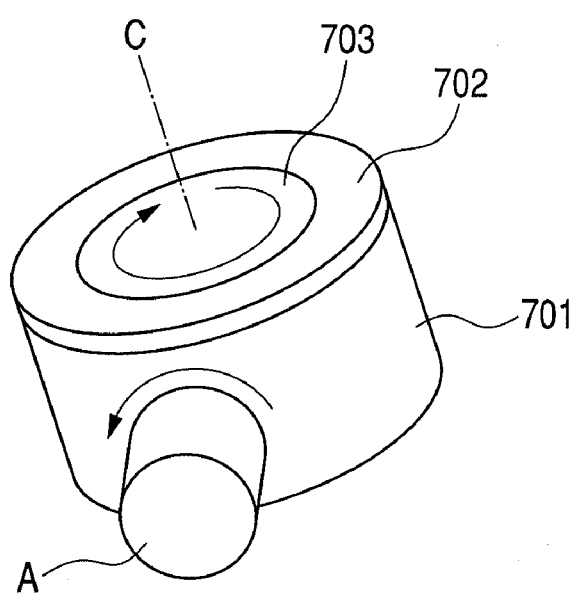
FIG. 7B is a perspective view of the substrate mounting stage according to the embodiment of the present invention.

FIG. 7A is a side view of a stage 701 that can be used as the stage of the sputtering apparatus in FIG. 6A. The stage 701 has a substrate mount 702 and a substrate 703 is mounted on the substrate mount 702. FIG. 7B is a perspective view of the stage 701 according to an embodiment of the present invention. The stage 701 is configured to be rotatable about the rotating shaft A as in the case of FIG. 6. The substrate mount 702 of the stage 701 is configured to be rotatable about a rotating shaft C that is perpendicular to the rotating shaft A and passes through the center of the substrate 703 and the substrate 703 can be rotated about the rotating shaft C. The substrate mount 702 can be rotated using rotation means such as a motor and the rotation means can be controlled by a control apparatus.

Figure 8:
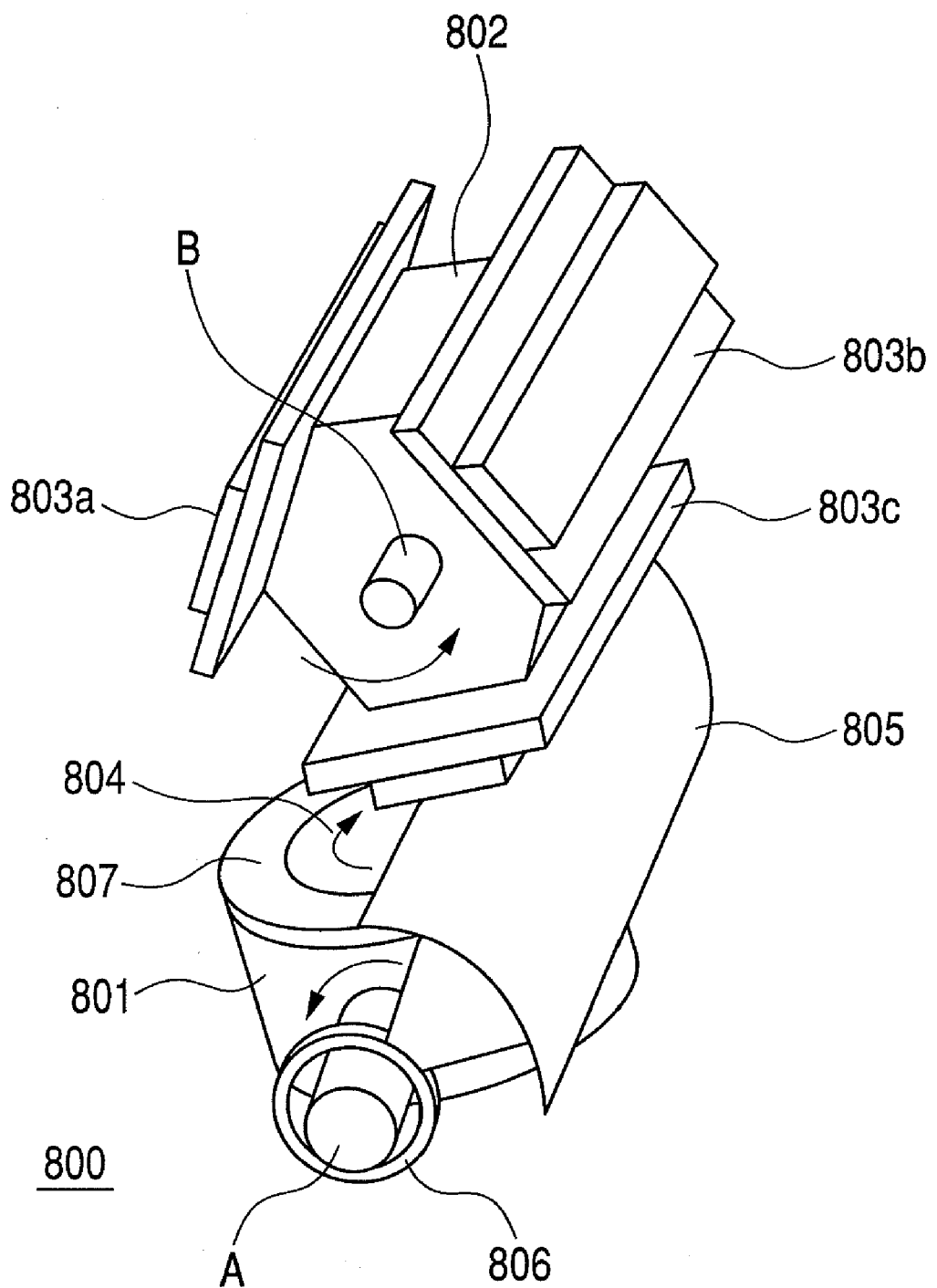
FIG. 8 shows an example of the sputtering apparatus according to the embodiment of the present invention.

FIG. 8 shows an example of the sputtering apparatus according to another embodiment of the present invention. The sputtering apparatus 800 is provided with a stage 801 on which a substrate 804 is mounted, a cathode 802 that supports a target 803 and a shielding plate 805. The stage 801 and the cathode 802 are provided with a rotating shaft A and a rotating shaft B respectively and at least one of the stage 801 and the cathode 802 is configured to rotate about the rotating shaft A and rotating shaft B within an arbitrary angle. For example, at least one of the stage 801 and the cathode 802 can be rotated using rotation means such as a motor and the rotation means can be controlled by the control apparatus. The rotating shaft A and the rotating shaft B are arranged parallel to each other and the target 803 is supported on the cathode 802 so as to be parallel to the rotating shaft B.

The target 803 supported on the cathode 802 which is rotatable about the rotating shaft B within an arbitrary angle can deposit sputtered particles onto the substrate 804 by causing ions in plasma to collide with the surface of the target 803 while either stationary or rotating.

The substrate 804 to which film deposition processing is applied by the targets 803a to 803c is mounted on the stage 801 which is rotatable about the rotating shaft A within an arbitrary angle. The stage 801 has a substrate mount 807 and the substrate 804 can be provided on the substrate mount 807. The substrate mount 807 of the stage 801 is configured to be rotatable about a rotating shaft (not shown) that is perpendicular to the rotating shaft A and passes through the center of the substrate 804 and the substrate 804 can be rotated about the rotating shaft. The substrate mount 807 can be rotated using rotation means such as a motor and the rotation means can be controlled by a control apparatus.

Furthermore, the shielding plate 805 is provided between the target and the stage 801, the shielding plate 805 has means for rotating about the rotating shaft A within an arbitrary angle and performs the function of fine tuning a thickness distribution of a film deposited and increasing selectivity of the angle of incidence of sputtered particles. The shielding plate 805 can rotate about the rotating shaft A independently of the cathode 802 or stage 801 by appropriately controlling shielding plate rotation means 806 by a control apparatus.

A film with enhanced orientation is normally made up of a plurality of layers and typical examples thereof are Ta/FeCo, NiFe/FeCo and NiFeCr/FeCo. In order to manufacture such a film made up of a plurality of layers, the target 803 supported on the cathode 802 is preferably plural in number. In the embodiment shown in FIG. 8, there are a plurality of targets 803a, 803b and 803c and the targets 803a, 803b and 803c can be used differently according to their uses as appropriate. The rotating shaft A and the rotating shaft B are arranged parallel to each other and the target 803a, 803b and 803c are supported on the cathode 802 so as to be parallel to the rotating shaft B. The targets 803a, 803b and 803c which are rotatable about the rotating shaft B cause sputtered particles to be deposited on the substrate 804 by causing ions in plasma to collide with the surface of the target 803.

First Embodiment

One of important aspects of the present invention is to reduce variations in the magnetically easy axis (hard axis) of a magnetic film formed through sputtering and uniformalize an atomic density in the magnetic film formed in a simple configuration.

Figure 9:
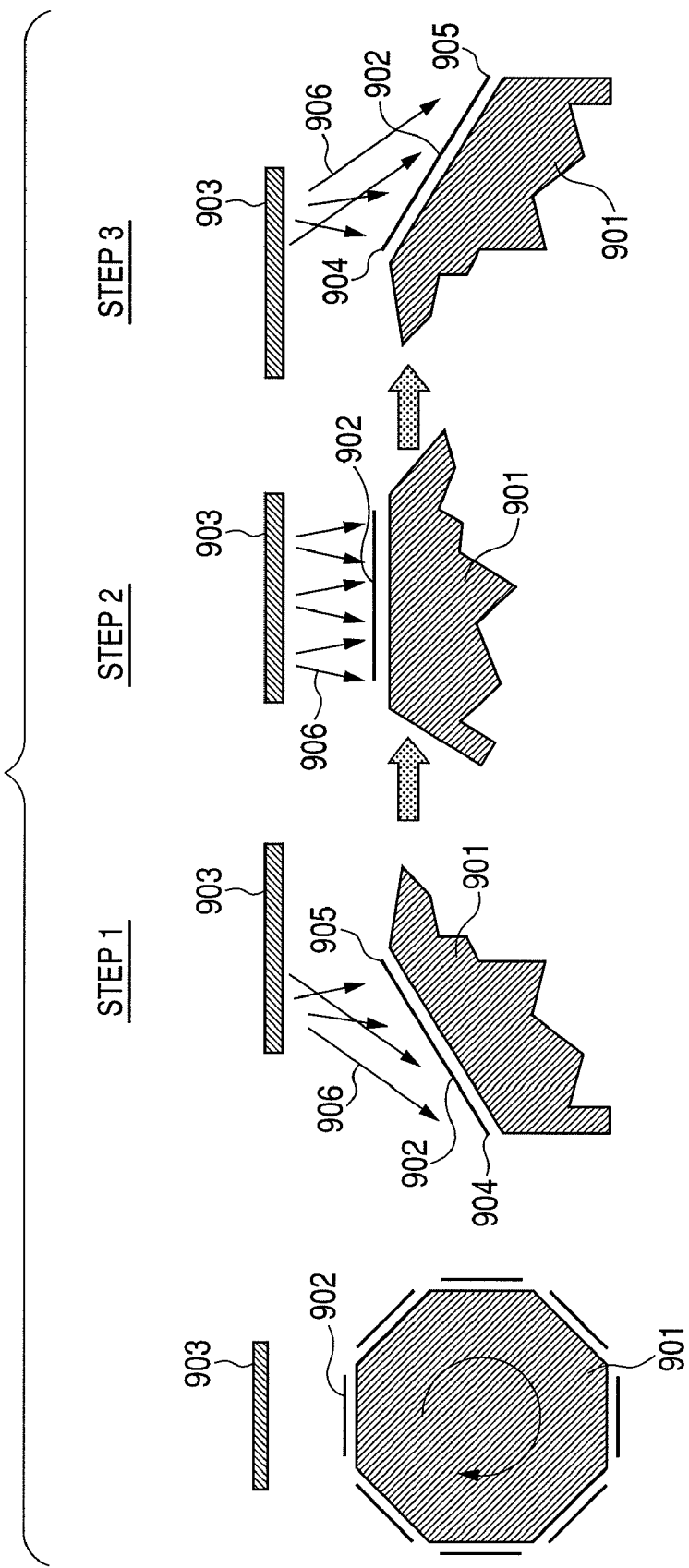
FIG. 9 is a diagram illustrating that variations are produced in the direction of the magnetically easy axis of a magnetic film formed by a conventional carousel type sputtering apparatus.

For example, in the case of the carousel type sputtering apparatus disclosed in Patent Document 1, variations occur in the direction of the magnetically easy axis of a magnetic film formed as shown below. FIG. 9 is a diagram illustrating that variations occur in the direction of the magnetically easy axis of the magnetic film formed by the conventional carousel type sputtering apparatus.

In FIG. 9, a substrate 902 is supported on a rotatable substrate holder 901 and a target 903 is disposed spaced apart from the substrate holder 901 by a predetermined distance. When sputtering is started in such a configuration, as shown in step 1 of FIG. 9, sputtered particles 906 impinge on a first end 904 of the substrate 902 at a high angle of incidence in an initial stage of sputtering to the substrate 902. On the other hand, sputtered particles 906 impinge on a second end 905 of the substrate 902 at a low angle of incidence. The substrate holder 901 then rotates in the direction of the arrow in FIG. 9 and when sputtering advances, processing is performed in order of step 2→step 3 in FIG. 9.

When attention is focused on the first end 904 in this case, when processing advances from step 1 to step 3 in FIG. 9, the angle of incidence of sputtered particles 906 impinging on the first end 904 changes from a high angle of incidence to a low angle of incidence continuously. Therefore, magnetization easy axes of different directions are distributed along the thickness direction of the film deposited at the first end 904. When attention is likewise focused on the second end 905, when processing advances from step 1 to step 3 in FIG. 9, the angle of incidence of sputtered particles 906 impinging at the second end 905 changes from a low angle of incidence to a high angle of incidence continuously. Therefore, in this case, magnetization easy axes of different directions are also distributed along the thickness direction of the film deposited at the second end 905.

That is, as described above, the direction of the magnetically easy axis may vary by 90° depending on the angle of incidence of sputtered particles impinging on the substrate. Therefore, when the angle of incidence dependency of sputtered particles occurs within the plane of the substrate, a region where the magnetically easy axis differs by 90° in the film thickness direction may be produced, which may deteriorate the angle of skew dispersion.

Furthermore, the greater the angle of incidence of sputtered particles is, the lower the atomic density in the magnetic film formed is, and a distribution also occurs in specific resistance within the plane of the magnetic film and the saturation magnetic flux density also decreases.

Figure 10:
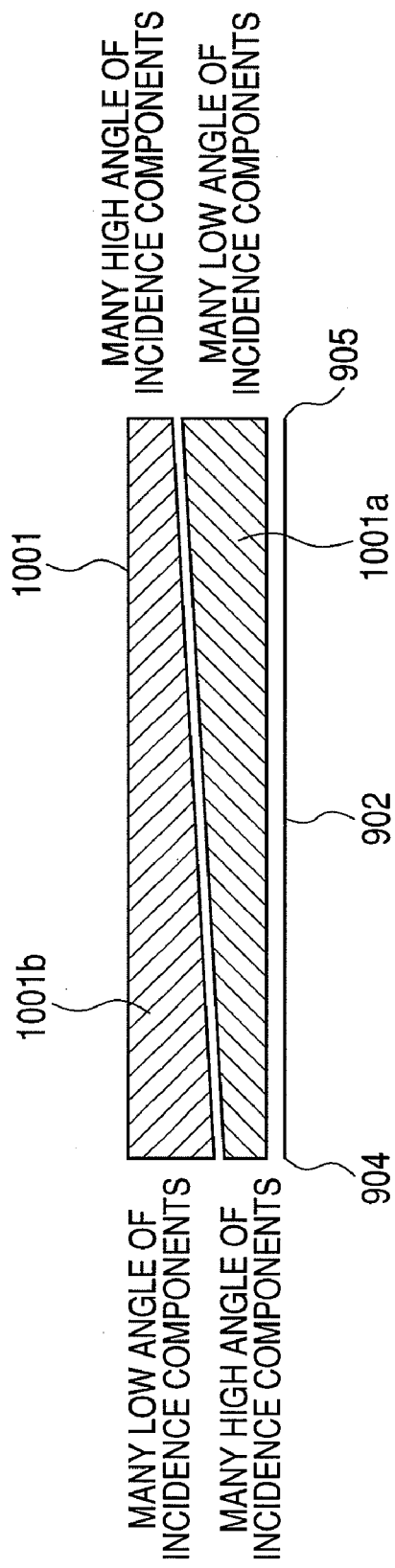
FIG. 10 is a schematic view illustrating variations in the magnetic characteristics and variations in the magnetically easy axis.

Furthermore, even if the film thickness distribution is uniform, the growth of crystal may change on the left and right of the substrate 902 as shown in FIG. 10. FIG. 10 is a schematic view for illustrating variations in the magnetic characteristics and variations on the magnetically easy axis. In FIG. 10, reference numeral 1001 denotes a magnetic film formed by sputtering. Reference numeral 1001a denotes the magnetic film formed in steps 1 and 2 in FIG. 9 and is the magnetic film where variations in the magnetic characteristics and variations on the magnetically easy axis are schematically expressed. Likewise, reference numeral 1001b denotes the magnetic film formed in steps 2 and 3 in FIG. 9 and is the magnetic film where variations in the magnetic characteristics and variations on the magnetically easy axis are schematically expressed. FIG. 10 shows that the greater the angle of the inclination of the diagonal line in the magnetic films 1001a and 1001b than that in the direction of the normal line of the substrate 902, the more sputtered particles have impinged at a high angle of incidence, and that the smaller the angle of the inclination of the diagonal line than that in the direction of the normal line of the substrate 902, the more sputtered particles have impinged at a low angle of incidence.

The magnetic films 1001a and 1001b are schematic views and FIG. 10 shows the magnetic film 1001a and the magnetic film 1001b separated from each other, but this is only intended to make the drawing easy to see.

As shown in step 1 in FIG. 9, from step 1 to step 2, many sputtered particles impinge at a high angle of incidence at the first end 904 of the substrate 902 and many sputtered particles impinge at a low angle of incidence at the second end 905.

Therefore, as shown in reference numeral 1001a, the magnetic film is formed. On the other hand, as shown in step 3 of FIG. 9, from step 2 to step 3, many sputtered particles impinge on the first end 904 at a low angle of incidence and many sputtered particles impinge on the second end 905 at a high angle of incidence. Therefore, the magnetic film is formed as shown by reference numeral 1001b. Therefore, in the eventually formed magnetic film 1001, the angle of incidence of sputtered particles that contribute to film formation differs between the region growing in an initial stage and the region growing in a final stage. Therefore, the direction of the magnetically easy axis may differ between the region growing in the initial stage and the region growing in the final stage, leading to variations in the magnetically easy axis and variations in the magnetic characteristics.

It is one of objects of the present embodiment to have a mask mechanism such as the shielding plates 606 and 805, optimize the operations thereof and reduce variations of the magnetically easy axis and variations in the magnetic characteristics. In attaining such objects, the inventor of the present application made every effort to study and experiment, and consequently discovered that the film formed is provided with magnetic anisotropy even if the angle of incidence of sputtered particles on the substrate is a low angle.

When sputtered particles impinge at a high angle of incidence as described above, the atomic density in the film formed decreases, a distribution of specific resistance occurs within the plane of the film and further a saturation magnetic flux density also decreases, which leads to variations of the magnetic characteristics. Therefore, the present embodiment has a feature of appropriately shielding sputtered particles that impinge at a high angle of incidence and controlling the shielding plate so that sputtered particles impinge on the substrate at a low angle of incidence. Performing such control can suppress the incidence of sputtered particles at a high angle of incidence, which causes a deterioration of the magnetic characteristics, and limit to the utmost extent the angle of incidence of sputtered particles to a low angle of incidence at which magnetic anisotropy can be added. Therefore, suppressing the angle of incidence of sputtered particles impinging on the substrate to a small level can align the direction of the magnetically easy axis while suppressing variations in specific resistance and suppressing the reduction of saturation magnetic flux density.

Hereinafter, the structure and operations of the sputtering apparatus according to the present embodiment using the sputtering apparatus shown in FIG. 8 will be explained.

Figure 11:
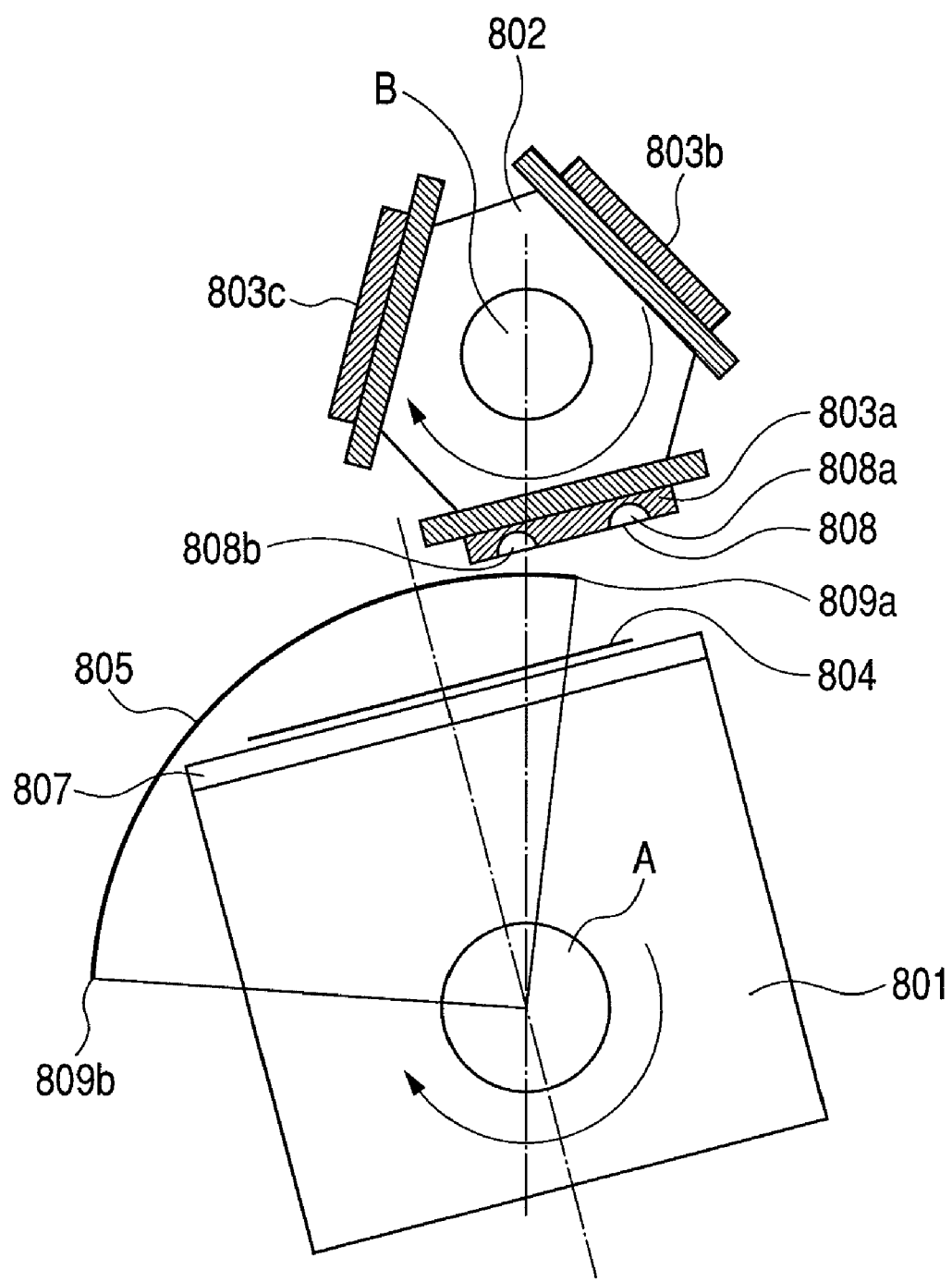
FIG. 11 shows the sputtering apparatus according to the embodiment of the present invention.

FIG. 11 shows a sputtering apparatus according to the present embodiment.

In FIG. 11, an erosion track (eroded section) 808 is formed in the target 803a. The erosion track may also be formed in the targets 803b and 803c. Furthermore, the substrate 804 is placed on the substrate mount 807 which is rotatable about the rotating shaft C, which is the normal direction of the substrate supporting surface of the stage 801, within an arbitrary angle.

In the present embodiment, it is important, as described above, to appropriately block sputtered particles impinging on the substrate at a high angle of incidence during sputtering and uniformalize the angle of incidence of sputtered particles impinging from the target on the substrate to a range of a low angle of incidence as much as possible. That is, the operation of the shielding plate 805 is controlled so that film deposition is performed with sputtered particles impinging at a low angle of incidence.

Therefore, at the start of sputtering, in the present embodiment, at least part of a first end 809a of the shielding plate 805 in the rotation direction of the shielding plate 805 is disposed at a position opposed to the region surrounded by the erosion track formed in the target. That is, the shielding plate 805 is disposed with respect to the substrate 804 so that the shielding plate 805 side of the erosion track 808 in the moving direction of the substrate 804 (that is, rotation direction of the stage 801) is at least shielded and the first end 809a of the shielding plate 805 is located in the region surrounded by the erosion track. When the shielding plate 805 is disposed in this way, the first end 809a of the shielding plate 805e is consequently located between the regions 808a and 808b of the erosion track. The shielding plate 805 may be moved (rotated) during sputtering if the first end 809a of the shielding plate 805 is located within the range between the region 808a and region 808b. Alternatively, the shielding plate 805 may be stopped during sputtering.

Thus, locating the first end 809a between the region 808a and region 808b during sputtering allows sputtered particles impinging on the substrate 804 at a high angle of incidence out of sputtered particles generated from the region 808a of the erosion track 808 to be appropriately blocked. That is, it is possible to prevent sputtered particles from impinging on the substrate 804 at a high angle of incidence. Furthermore, since sputtered particles generated from the region 808b of the erosion track 808 are appropriately blocked by the shielding plate 805, the angle of incidence of sputtered particles from the target 808 on the substrate 804 can be contained within a range of low angle of incidence.

According to the present embodiment, the cathode 802, which is rotatable about the rotating shaft B, may be rotated or stopped during sputtering.

Furthermore, the rotation angular velocity of the stage 801 may be adjusted and the film thickness distribution may be adjusted. The greater the rotation angular velocity of the stage 801, the lower the film deposition rate of the corresponding region on the substrate 804 becomes. Therefore, the rotation of the stage 801 may be controlled in such a way that the rotation angular velocity is reduced at the time of a start of sputtering when the film deposition rate is low and the rotation angular velocity is increased when the film deposition rate is high and when the target surface is parallel to the substrate surface.

The present embodiment rotates at least one of the stage 801, cathode 802 and shielding plate 805 during sputtering while maintaining the condition in which at least part of the first end 809a of the shielding plate 805 in the region (between the region 808a and region 808b) surrounded by the erosion track 808 formed in the target 803a, which becomes the target. Under such control, the angle of incidence of sputtered particles from the target 808 on the substrate 804 is contained within a predetermined range. That is, the rotation of at least one of the stage 801, cathode 802 and shielding plate 805 is controlled so that the angle of incidence on the substrate 804 from the region of the erosion track 808 not shielded by the shielding plate 805 falls within a range of a predetermined low angle of incidence.

Figure 12:
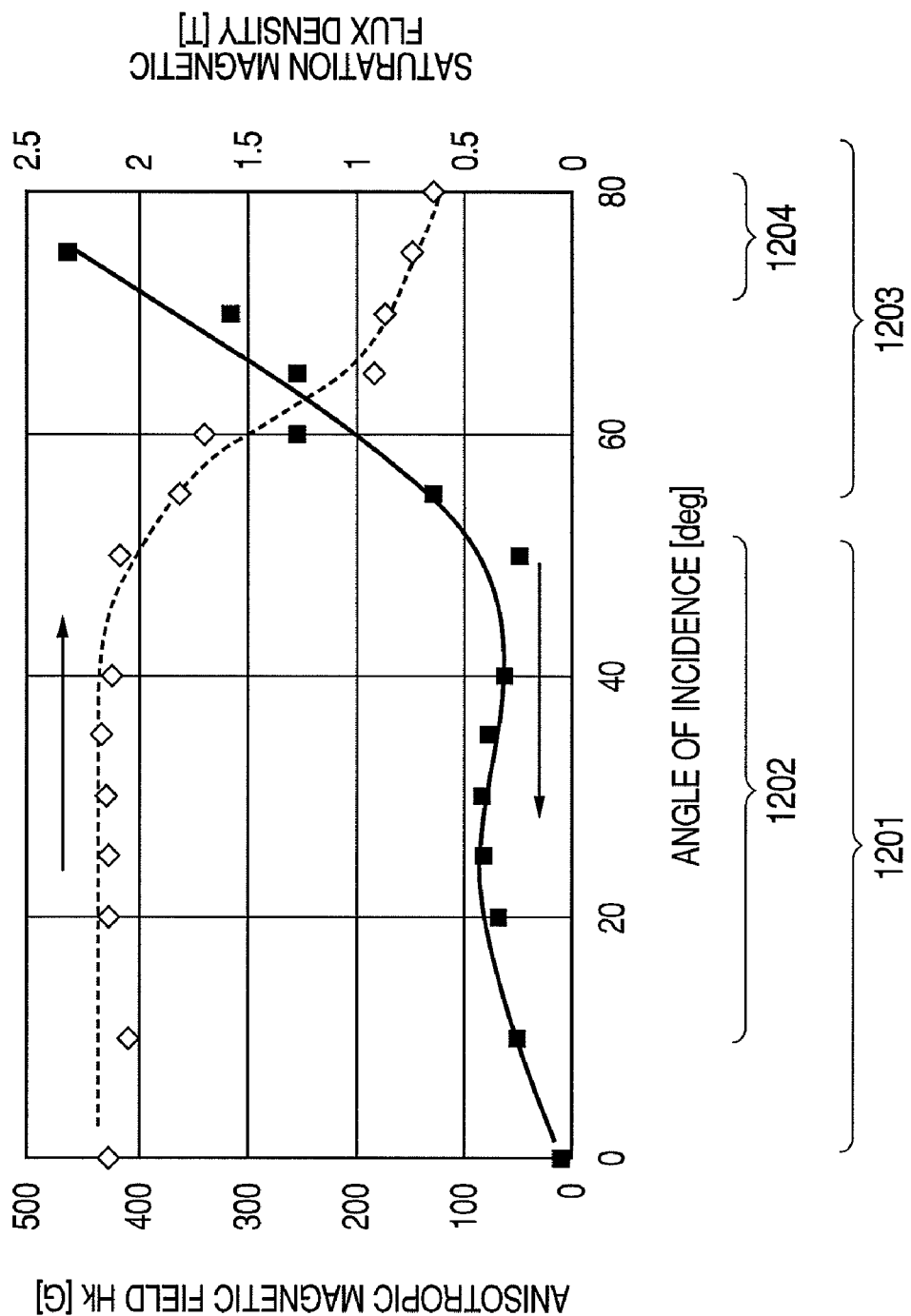
FIG. 12 shows the angle of incidence dependency of the angle of incidence and magnetic characteristics of sputtered particles according to the embodiment of the present invention.

In the present embodiment, the range of the predetermined low angle of incidence is preferably 0° or more and 50° or less and more preferably 10° or more and 50° or less. FIG. 12 shows the angle of incidence dependency of the angle of incidence of sputtered particles and magnetic characteristics of the present embodiment.

As is understandable from FIG. 12, the direction of the magnetically easy axis can be appropriately aligned if the angle of incidence is contained within the range of 0° or more and 50° or less (range 1201) and the saturation magnetic flux density can also be increased. Furthermore, if the angle of incidence is contained within the range of 10° or more and 50° or less (range 1202), the angle of incidence of 0° or more and less than 10° where the anisotropic magnetic field decreases more or less can be cut, and therefore the direction of the magnetically easy axis can further be aligned appropriately.

On the other hand, when the angle of incidence exceeds 50° (range 1203), the saturation magnetic flux density of the magnetic film formed decreases. Furthermore, when the angle of incidence is 70° or more (range 1204), the direction of the magnetically easy axis changes by 90°.

Thus, as is also understandable from FIG. 12, by rotating at least one of the stage 801, cathode 802 and shielding plate 805 so that the angle of incidence falls within the ranges 1201 and 1202 during sputtering, variations in the direction of the magnetically easy axis can be suppressed while increasing the saturation magnetic flux density. The present embodiment controls the rotation of the stage 801, cathode 802 and shielding plate 805 independently of each other so that sputtered particles impinge on the substrate 804 within the above range 1201 at respective instants of sputtering.

However, even if the quantity of sputtered particles within the ranges 1201 and 1202, which are preferable ranges of the low angle of incidence, is increased positively, an increase of the proportion of sputtered particles impinging at an angle of incidence greater than 50° may cause the direction of the magnetically easy axis to change by 90° as described above or may lead to a reduction of the atomic density in the film. Therefore, anisotropy is formed in a direction different from the direction that should originally be aimed, leading to variations in an in-plane distribution of the magnetically easy axis.

Figure 13:
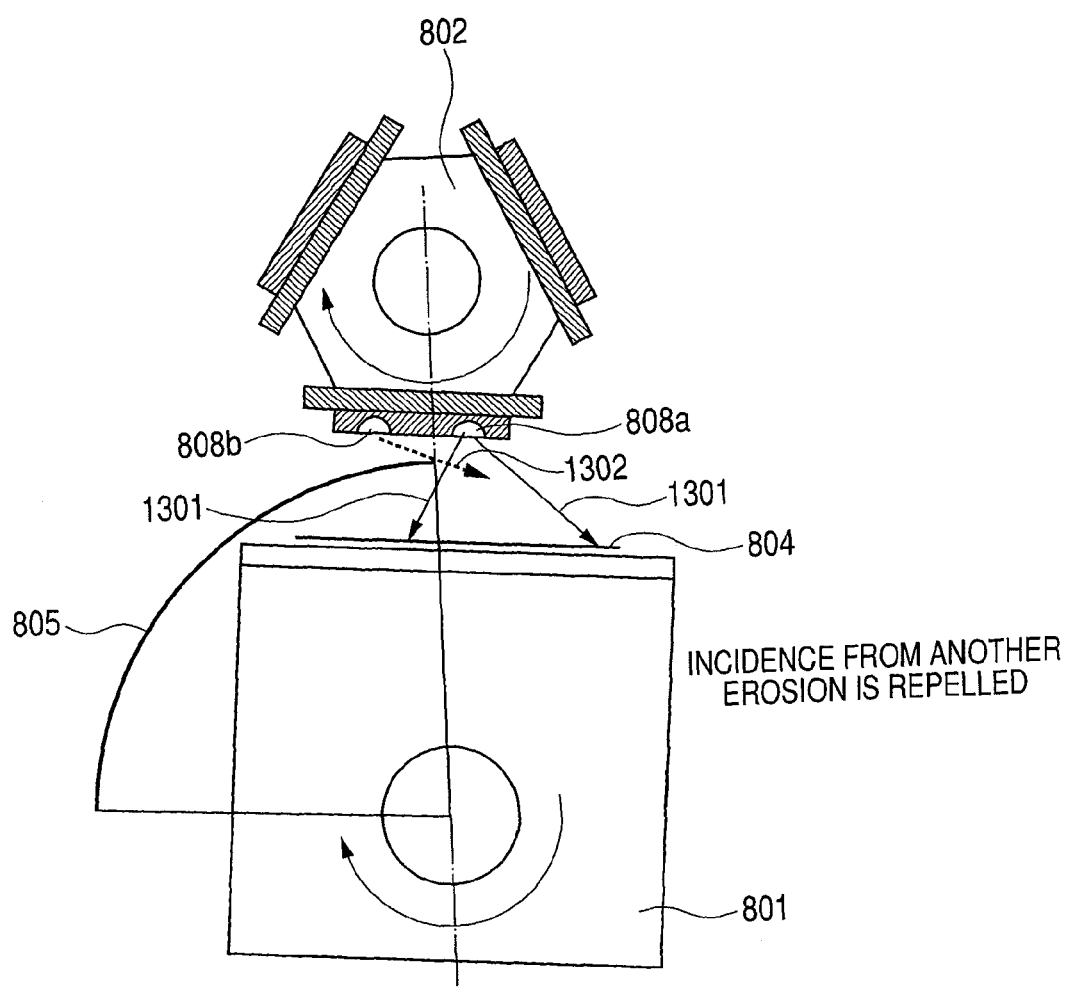
FIG. 13 is a diagram illustrating control of the sputtering apparatus according to the embodiment of the present invention.

Thus, the present embodiment controls the rotations of the stage 801, cathode 802 and shielding plate 805 independently of each other so that sputtered particles having an angle of incidence greater than 50° do not impinge on the substrate 804. That is, as shown in FIG. 13, for example, control is performed such that of sputtered particles generated from the region 808a of the erosion track 808, sputtered particles 1301 whose angle of incidence is 50° or less are made to impinge on the substrate 804 and sputtered particles from the region 808a whose angle of incidence is greater than 50° and sputtered particles 1302 generated from the region 808b are not made to impinge on the substrate 804.

Next, operations of the sputtering apparatus according to the present embodiment will be explained using FIG. 14. Prior to a start of sputtering, the sputtering apparatus controls the cathode 802 and shielding plate 805 so that the first end 809a of the shielding plate 805 is located between the regions 808a and 808b of the erosion track 808 first. Next, the stage 801, cathode 802 and shielding plate 805 are positioned so as to shield the angle of incidence greater than 50° of sputtered particles impinging from the target 803a on the substrate 804. Such positioning may be determined beforehand through experiments or the like.

Figure 14:
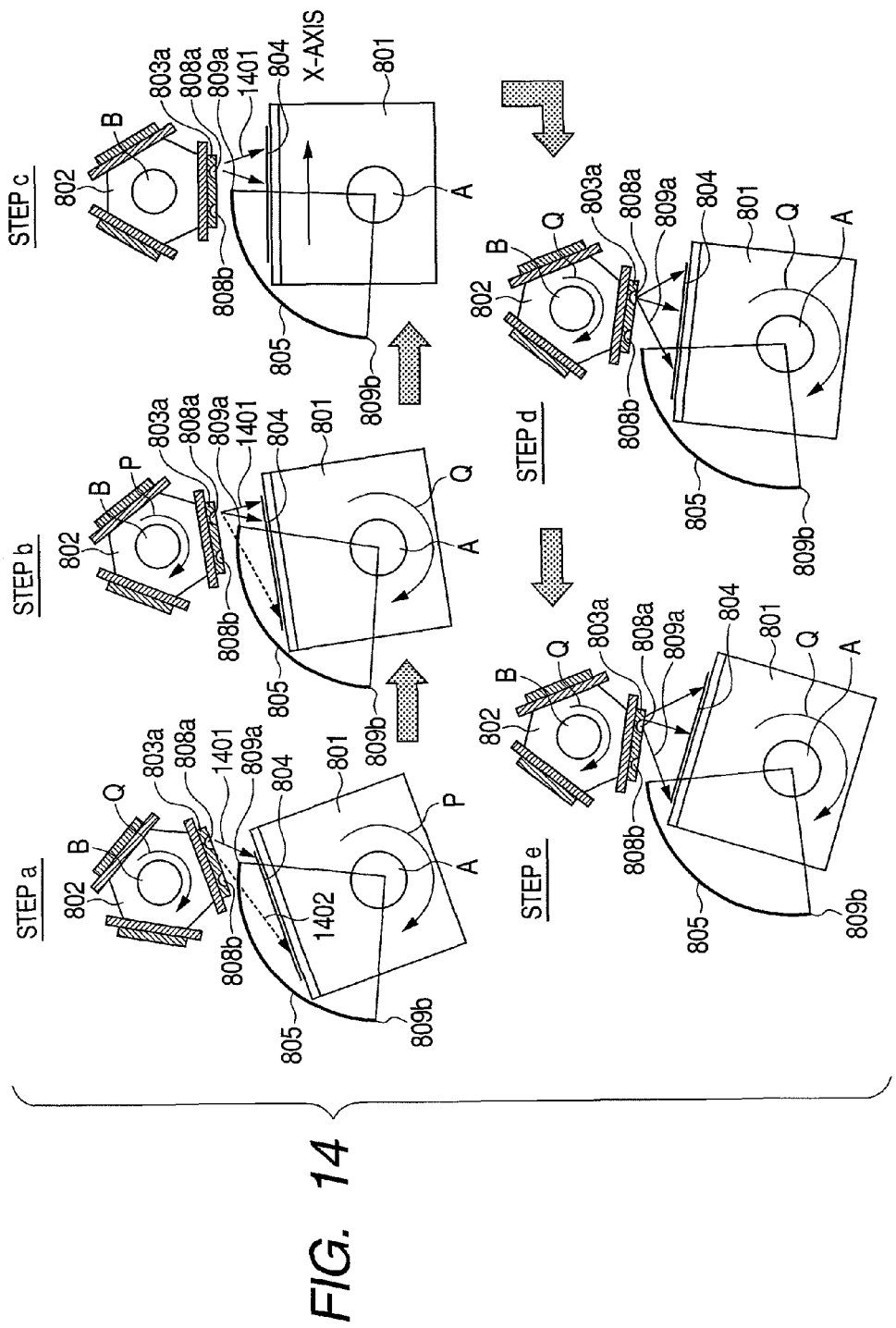
FIG. 14 is a diagram illustrating operations of the sputtering apparatus according to the embodiment of the present invention.

Next, when sputtering processing starts, sputtering is performed according to step a to step e in FIG. 14. In this case, the sputtering apparatus rotates the stage 801 along an arrow P in each step a to step e and rotates the cathode 802 along an arrow Q. Furthermore, the shielding plate 805 is rotated as required so that the shielding plate 805 is located between the regions 808a and 808b, sputtered particles 1402 impinging from the target 803a at an angle of incidence greater than 50° are shielded and sputtered particles 1401 at an angle of incidence of 0° or more and 50° or less are made to impinge on the substrate 804. That is, the sputtering apparatus controls the rotations of the stage 801, cathode 802 and shielding plate 805 independently of each other so that sputtered particles 1401 having an angle of incidence of 0° or more and 50° or less impinge on the substrate 804 during sputtering processing. Control of such conditions may be determined beforehand through experiments or the like.

The film thickness distribution can be adjusted by continuously changing the rotation of the stage 801 in step a to step c in FIG. 14 from slow to fast states and continuously changing the rotation of the stage 801 in step c to step e from fast to slow states.

Operating the apparatus in this way allows the shielding plate 805 to prevent sputtered particles having a high angle of incidence (e.g., angle of incidence of 50° or higher) from contributing to film deposition. Therefore, the angle of incidence of sputtered particles contributing to film deposition can be contained within the range of a low angle of incidence (e.g., 0° or more and 50° or less) as much as possible, and therefore it is possible to suppress variations in the magnetically easy axis and reduction of the saturation magnetic flux density.

A case has been explained above where a target in which an erosion track is formed is used, but the present embodiment is also applicable to a case where a target such as a new target in which no erosion track is formed is used. When, for example, a cathode having a first magnet with one polarity and a second quasi-rectangular magnet with the other polarity disposed so as to surround the first magnet and not to contact the first magnet is used, an aggregate of regions where the vertical component of the cathode with respect to the target supporting surface out of magnetic tunnels produced between the first magnet and the second quasi-rectangular magnet in the magnetic field generated on the target becomes 0 substantially corresponds to the erosion track. Therefore, when a target in which no erosion track is formed is used, the first end may be disposed on the region surrounded by the above aggregate. The above aggregate becomes an erosion track as sputtering advances. Therefore, the above effect can be provided if at least part of one end of the shielding plate exists in the region surrounded by the above aggregate, whether or not the erosion track exists on the target.

The present embodiment may also use a circular magnet instead of the second rectangular magnet. In the present embodiment, it is important that a loop shape be formed so that the magnet with the other polarity surrounds the first magnet and any shape can be adopted for the loop shape.

EMBODIMENTS

Sputtering was conducted under the following conditions.
<Configuration of Apparatus>
Distance from center of rotation of stage 801 to substrate surface: 330 mm
Substrate size (diameter): 200 mm
Diameter of shielding plate: 390 mm
Distance when target faces substrate in substantially parallel to each other: 100 mm
Distance from rotating shaft B of cathode 802 to target surface: 160 mm
Target size: 450 mm×130 mm
Target thickness: 4 mm
Target material: $Fe_{65}Co_{35}$ (atomic %)
<Film Deposition Condition>
Gas: argon
Gas pressure: 0.05 Pa
Discharge power: 4000 W
Angle of incidence of sputtered particles impinging on main: 35°

Figure 15:
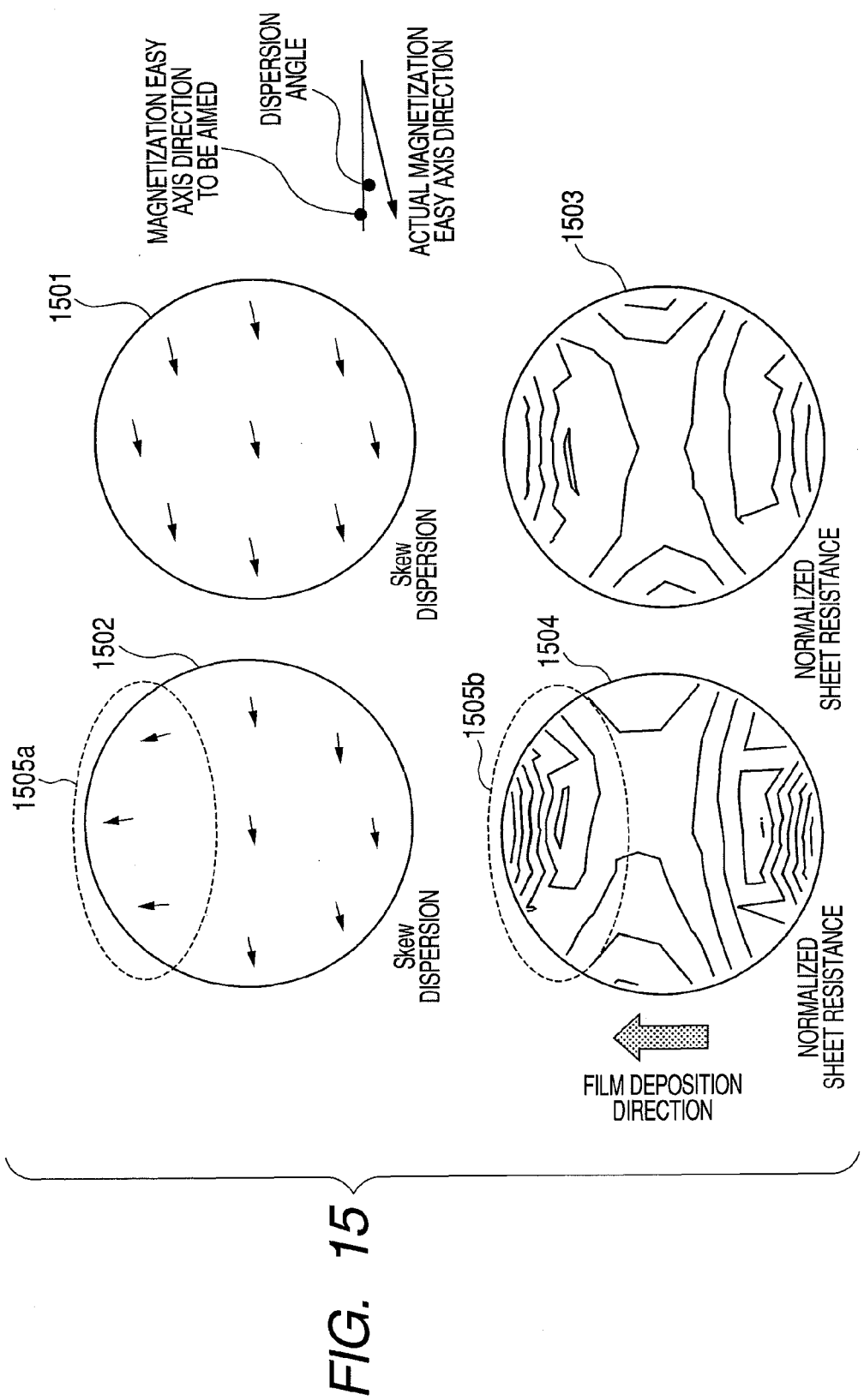
FIG. 15 is a diagram illustrating effects of a magnetic film manufactured by the sputtering apparatus according to the embodiment of the present invention.

Sputtering was conducted through the operations explained in FIG. 14 using the sputtering apparatus shown in FIG. 11 under the above conditions. FIG. 15 shows skew dispersion of the magnetic film obtained through the sputtering and normalized sheet resistance, and skew dispersion and normalized sheet resistance manufactured using a conventional method.

In FIG. 15, reference numeral 1501 denotes a diagram showing skew dispersion of a magnetic film manufactured according to the present embodiment, reference numeral 1502 denotes a diagram showing skew dispersion of a magnetic film manufactured using a conventional method without removing high angle of incidence components of sputtered particles. Furthermore, reference numeral 1503 denotes a diagram showing normalized sheet resistance of a magnetic film manufactured according to the present embodiment and reference numeral 1504 denotes a diagram showing normalized sheet resistance of a magnetic film manufactured according to the above conventional method.

As is understandable from FIG. 1501 showing skew dispersion of the present invention, skew dispersion is uniform in the magnetic film manufactured according to the present embodiment and the formed magnetization easy axes are appropriately aligned. On the other hand, as is understandable from FIG. 1502 showing conventional skew dispersion, there is discrepancy in skew dispersion in a region 1505*a* of the magnetic film manufactured using the conventional method, causing variations in the magnetically easy axis. The region 1505*a* is a region where there are many sputtered particles whose angle of incidence is greater than 50°.

Furthermore, as is understandable from FIG. 1503 showing normalized sheet resistance of the present invention, normalized sheet resistance of the magnetic film manufactured according to the present embodiment is satisfactory. In contrast, as is understandable from FIG. 1504 showing conventional normalized sheet resistance, there is an increase of the sheet resistance value in a region 1505*b* and the atomic density in the film decreases in the magnetic film manufactured using the conventional method. The region 1505*b* is a region where there are many sputtered particles whose angle of incidence is greater than 50°.

In the present embodiment, the sputtering apparatus is controlled so that a high angle of incidence component (e.g., an angle greater than 50°) is not caused to impinge on the substrate as much as possible and a low angle of incidence component (e.g., 0° or more and 50° or less) is caused to impinge on the substrate. Therefore, the present embodiment can prevent magnetization easy axes deviated by 90° from being formed and satisfactorily align the directions of magnetization easy axes. Furthermore, since the present embodiment prevents sputtered particles impinging at a high angle of incidence from impinging on the substrate as much as possible, it is possible to suppress the reduction of an atomic density of the film formed.

Thus, since the conventional method does not remove the high angle of incidence component of sputtered particles, the magnetic characteristic distribution increases, but applying the present embodiment increases selectivity of an angle of incidence of sputtered particles and can thereby improve the magnetic characteristic distribution.

Second Embodiment

The present embodiment further provides a second shielding plate for the sputtering apparatus explained in the first embodiment. Providing an additional shielding plate in this way can block an angle of incidence component in a predetermined range on the 0° side (e.g., 0° or more and less than 10°) of the low angle of incidence.

Figure 16:
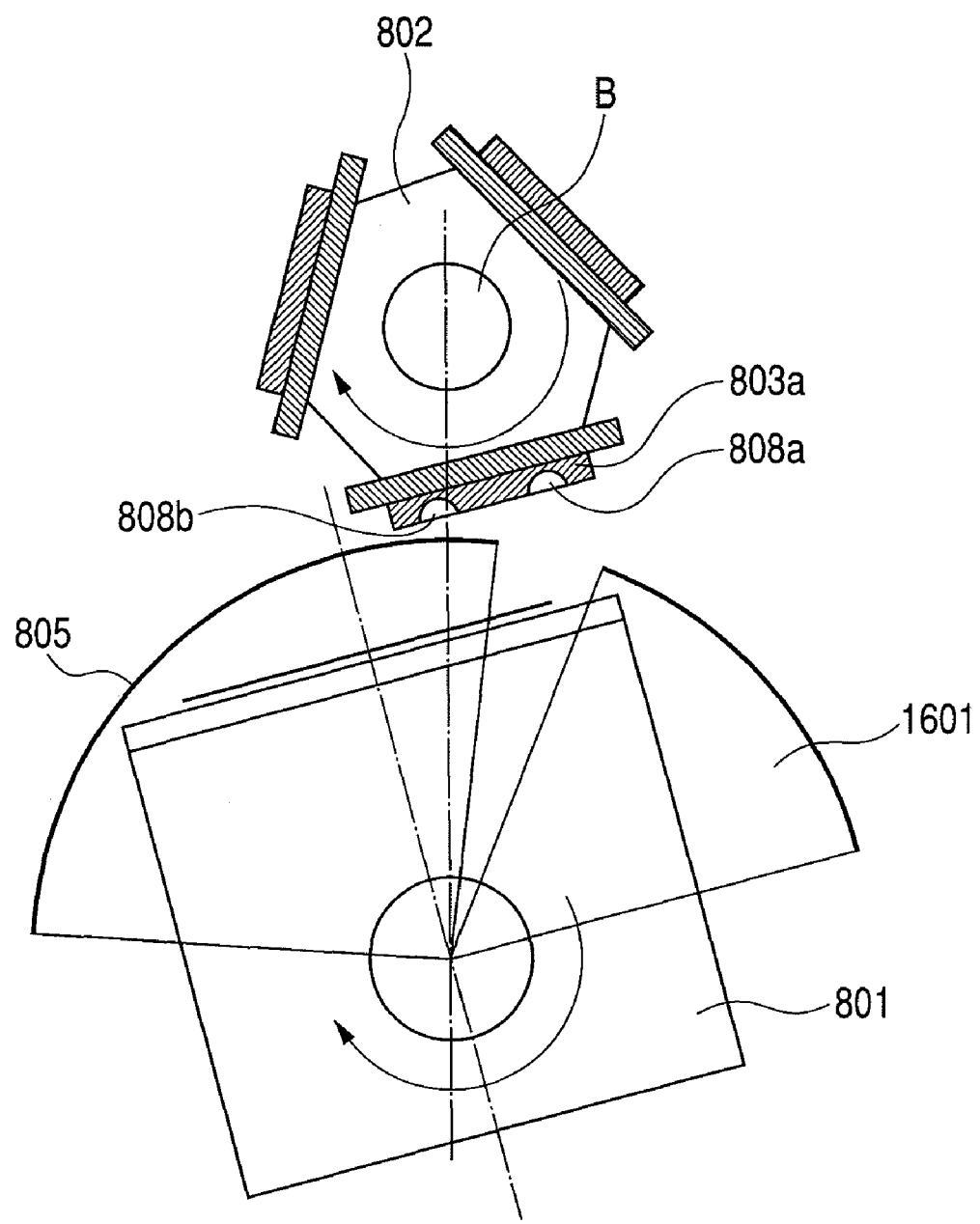
FIG. 16 shows the sputtering apparatus according to the embodiment of the present invention.

FIG. 16 shows a sputtering apparatus according to the present embodiment.

In FIG. 16, reference numeral 1601 denotes a second shielding plate. The second shielding plate 1601 is provided with means for rotating about a rotating shaft A within an arbitrary angle and performs the functions of fine tuning the film thickness distribution of a film deposited together with the shielding plate 805 and increasing selectivity of the angle of incidence of sputtered particles. The second shielding plate 1601 can rotate about the rotating shaft A independently of the cathode 802, stage 801 or shielding plate 805 by appropriately controlling the shielding plate rotation means through a control apparatus.

According to the present embodiment, the sputtering apparatus controls at least one of the stage 801, cathode 802, shielding plate 805 and second shielding plate 1601 so that a high angle of incidence component (angle greater than 50°) of sputtered particles generated from the region 808*a* of the erosion track 808 is blocked by the shielding plate 805 and an angle of incidence component of 0° or more and less than 10° is blocked by the second shielding plate 1601. Therefore, the angle of incidence on the substrate 804 can be contained within a range of 10° or more and 50° or less, which is a range of a preferable low angle of incidence.

Third Embodiment

As shown in step a to step e in FIG. 14, the above embodiment performs sputtering on the entire surface of the substrate at a time. The present embodiment optimally controls a substrate transfer method during sputtering or a positional relationship between a mask mechanism, substrate and target so that the magnetic characteristics in the upper and lower (right and left) parts in the film formed become symmetric. That is, when film deposition is completed up to half the film to be formed, the present embodiment rotates the substrate by 180° or performs film deposition for the remaining half by moving the shielding plate.

When, for example, the substrate is rotated 180° upon completing film deposition for half the substrate, film deposition is performed for half the substrate by carrying out step a to step c in FIG. 14, sputtering operation is stopped once after film deposition is completed up to half the substrate 804, the substrate mount 807 is rotated by 180° and the stage 801, cathode 802 and shielding plate 805 are returned to the positions shown in step a in FIG. 14. Film deposition is then performed for the remaining half the substrate 804 by carrying out step a to step c in FIG. 14 again.

Furthermore, when, for example, the shielding plate 805 is moved upon completing film deposition for half the substrate, the shielding plate 805 is rotated so that the second end 809*b* of the shielding plate 805 is positioned between the region 808*a* and region 808*b* of the erosion track 808, and the region to be shielded for the substrate 804 by the shielding plate 805 is changed from the region 808*b* to the region 808*a*. For the rest, step a to step c in FIG. 14 are carried out under similar control, and film deposition for the remaining half the substrate 804 can thereby be performed.

Thus, asymmetry within the plane of the film deposited can be reduced by performing film deposition for half the substrate at a time in similar steps.

The above described embodiment can be developed for not only the above described target material ($Fe_{65}Co_{35}$) but also an FeCo alloy represented by FeCoB or the like or NiFe alloy.

The invention claimed is:

1. A sputtering apparatus comprising:
a cathode having a sputtering target supporting surface, the sputtering target supporting surface being rotatable about a first rotating shaft;
a stage having a substrate supporting surface, the substrate supporting surface being rotatable about a second rotating shaft disposed parallel to the first rotating shaft; and
a shielding plate disposed between the sputtering supporting surface and the substrate supporting surface that is rotatable about the first rotating shaft or the second rotating shaft,
wherein the rotation of at least one of the sputtering target supporting surface, the substrate supporting surface and the shielding plate is controlled so that sputtered particles impinging at an angle formed with respect to a normal line of the substrate supporting surface of 0° or more and 50° or less out of sputtered particles generated from the sputtering target supported on the sputtering target supporting surface during sputtering are made to impinge on the substrate supported on the substrate supporting surface, and
when sputtering is performed with a target disposed on the sputtering target supporting surface, at least part of a first end in a rotation direction of the shielding plate is positioned in a region surrounded by an aggregate of regions where a vertical component of a magnetic field generated from the cathode of the target disposed in the cathode with respect to the sputtering target supporting surface becomes 0.

2. The sputtering apparatus according to claim 1, wherein when film deposition is completed up to half a film to be formed during the sputtering, at least part of a second end opposite to the first end of the shielding plate is located in the region.

3. The sputtering apparatus according to claim 1, wherein the sputtering apparatus controls the rotation of at least one of the cathode, stage and shielding plate so that sputtered particles impinging at an angle formed with respect to the normal line of 10° or more and 50° or less out of sputtered particles generated from a sputtering target supported on the sputtering target supporting surface during sputtering are made to impinge on a substrate supported on the substrate supporting surface.

4. The sputtering apparatus according to claim 3, further comprising a second shielding plate disposed between the sputtering supporting surface and the substrate supporting surface that is rotatable about the first rotating shaft or second rotating shaft,
wherein the shielding plate and the second shielding plate shield the substrate against sputtered particles impinging at an angle formed with respect to the normal line of 0° or more and less than 10° and 50° or more out of sputtered particles generated from the sputtering target.

5. The sputtering apparatus according to claim 1, wherein the sputtering apparatus controls the rotation of at least one of the sputtering target supporting surface, the substrate supporting surface and the shielding plate so as to shield the substrate against sputtered particles impinging at an angle formed with respect to the normal line greater than 50° out of sputtered particles generated from the sputtering target.

6. The sputtering apparatus according to claim 1, wherein the stage comprises a substrate mount which is rotatable about a third rotating shaft perpendicular to the second rotating shaft, and when film deposition is completed up to half a film to be formed during the sputtering, the substrate mount is rotated by 180° around the third rotating shaft.

7. The sputtering apparatus according to claim 1, further comprising a control apparatus for controlling the rotation of at least one of the sputtering target supporting surface, the substrate supporting surface and the shielding plate.

8. The sputtering apparatus according to claim 1, wherein the cathode has a plurality of sputtering target supporting surfaces and the plurality of sputtering target supporting surfaces are disposed around the cathode.

9. A film deposition method by a sputtering apparatus comprising:
a cathode having a sputtering target supporting surface, the sputtering target supporting surface being rotatable about a first rotating shaft;
a stage having a substrate supporting surface, the substrate supporting surface being rotatable about a second rotating shaft disposed parallel to the first rotating shaft; and
a shielding plate disposed between the sputtering supporting surface and the substrate supporting surface that is rotatable about the first rotating shaft or the second rotating shaft,
wherein at least one of the sputtering target supporting surface, the substrate supporting surface and the shielding plate is rotated independently so that sputtered particles impinging at an angle formed with respect to a normal line of the substrate supporting surface of 0° or more and 50° or less out of sputtered particles generated from the sputtering target supported on the sputtering target supporting surface during sputtering are made to impinge on the substrate supported on the substrate supporting surface, and
during the sputtering, at least part of a first end in a rotation direction of the shielding plate is positioned in a region surrounded by an aggregate of regions where a vertical component of a magnetic field generated from the cathode of the target disposed in the cathode with respect to the sputtering target supporting surface becomes 0.

10. The film deposition method according to claim 9, wherein when film deposition is completed up to half a film to be formed during the sputtering, at least part of a second end opposite to the first end of the shielding plate is located in the region.

11. The film deposition method according to claim 9, wherein at least one of the cathode, stage and shielding plate is rotated independently so that sputtered particles impinging at an angle formed with respect to the normal line of 10° or more and 50° or less out of sputtered particles generated from a sputtering target supported on the sputtering target supporting surface during sputtering are made to impinge on a substrate supported on the substrate supporting surface.

12. The film deposition method according to claim 11, wherein the sputtering apparatus further comprises a second shielding plate disposed between the sputtering supporting surface and the substrate supporting surface that is rotatable about the first rotating shaft or second rotating shaft,
wherein the substrate is shielded against sputtered particles impinging at an angle formed with respect to the normal line of 0° or more and less than 10° and 50° or more out of sputtered particles generated from the sputtering target.

13. The film deposition method according to claim 9, wherein at least one of the sputtering target supporting surface, the substrate supporting surface and the shielding plate is rotated independently so as to shield the substrate against sputtered particles impinging at an angle formed with respect to the normal line greater than 50° out of sputtered particles generated from the sputtering target.

14. The film deposition method according to claim 9, wherein the stage comprises a substrate mount which is rotatable about a third rotating shaft perpendicular to the second rotating shaft, and when film deposition is completed up to half a film to be formed during the sputtering, the substrate mount is rotated by 180° around the third rotating shaft.

\* \* \* \* \*